(12) United States Patent
Hsueh

(10) Patent No.: US 7,326,951 B2
(45) Date of Patent: Feb. 5, 2008

(54) CHALCOGENIDE RANDOM ACCESS MEMORY

(75) Inventor: Ming-Hsiang Hsueh, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 71 days.

(21) Appl. No.: 11/163,062

(22) Filed: Oct. 4, 2005

(65) Prior Publication Data
US 2006/0131618 A1 Jun. 22, 2006

Related U.S. Application Data

(63) Continuation-in-part of application No. 10/905,115, filed on Dec. 16, 2004, now Pat. No. 6,972,429.

(51) Int. Cl.
*H01L 29/06* (2006.01)

(52) U.S. Cl. .................... 257/2; 257/3; 257/529

(58) Field of Classification Search ............ 257/1–5, 257/529, 296, E43.004, E45.002, 21.004, 257/E21.582, E27.004 E; 438/95, 96, 98, 438/407, 723, 525, 501, 705
See application file for complete search history.

(56) References Cited

U.S. PATENT DOCUMENTS 5,920,788 A * 7/1999 Reinberg .................... 438/466
6,569,705 B2 * 5/2003 Chiang et al. ............... 438/95
2003/0155589 A1 * 8/2003 Campbell et al. ........... 257/225

* cited by examiner

Primary Examiner—Jerome Jackson
Assistant Examiner—Jami M Valentine
(74) Attorney, Agent, or Firm—Jianq Chyun IP Office

(57) ABSTRACT

A chalcogenide random access memory (CRAM) is provided. The CRAM includes a substrate, a first dielectric layer, a bottom electrode, a top electrode, a second dielectric layer, a modified chalcogenide spacer and an un-modified chalcogenide thin film. The first dielectric layer is disposed on the substrate and the bottom electrode is located inside the first dielectric layer. The second dielectric layer is disposed on the first dielectric layer and it has at least one opening exposing the bottom electrode. The modified chalcogenide spacer is disposed on the sidewall of the opening exposing portion of the bottom electrode. The top electrode is disposed on the bottom electrode. The un-modified chalcogenide thin film is disposed between the modified chalcogenide spacer and the top electrode and also disposed between the bottom electrode and the top electrode. The modified chalcogenide spacer has a better etching resistivity than the un-modified chalcogenide thin film.

12 Claims, 11 Drawing Sheets

CHALCOGENIDE RANDOM ACCESS MEMORY

CROSS-REFERENCE TO RELATED APPLICATION

This application is a continuation-in-part of a prior application Ser. No. 10/905,115, filed Dec. 16, 2004 now U.S. Pat. No. 6,972,429.

BACKGROUND OF THE INVENTION

1. Field of the Invention

The present invention relates to a phase transformation memory and fabricating method thereof. More particularly, the present invention relates to a chalcogenide random access memory (CRAM) and method of fabricating the same.

2. Description of the Related Art

To satisfy the need for varieties, compactness, high density, low production cost and customization in memory products, an increasing large list of memory fabrication techniques are being investigated. One type of technique that receives particular attention is a phase-transformation memory. Phase-transformation is a process of changing a material from a non-crystalline state into a crystalline state or changing the crystalline state to a non-crystalline state. Because a non-crystalline material has a different light reflecting properties and electrical resistance from a crystalline material, the non-crystalline state and the crystalline state of the material can be used to represent a "0" and a "1" logic state in data storage. The aforementioned phase-transformation will occur when a laser beam or an electrical field is applied.

At present, a film fabricated using a compound from an alloy system material having erasable and phase-transformable properties called chalcogenide, consisting of germanium (Ge), antimony (Sb) and tellurium (Te) of the sulfur series, can be made to phase-transformation at a relatively low voltage. Moreover, the electrical properties after the phase transformation are particularly suitable for fabricating a memory. Furthermore, the area occupation of the chalcogenide random access memory (CRAM) is only ⅓ of the magnetic random access memory (MRAM) and the ferroelectric random access memory (FeRAM) and the CRAM can easily integrate with a logic circuit. Therefore, CRAM has gradually become one of the most promising techniques for producing a whole new generation of memory products, especially for miniaturized portable products.

The chalcogenide RAM store data by effecting a phase transformation through the power source controlled by a transistor. However, the current that can be provided by a transistor is quite limited. Hence, one major issue is to achieve a balance between the operating current of the chalcogenide RAM and the current range provided by the transistor.

SUMMARY OF THE INVENTION

Accordingly, at least one objective of the present invention is to provide a chalcogenide random access memory (CRAM) capable of reducing the difference between an operating current of the CRAM and a current provided by a control transistor.

At least another objective of the present invention is to provide a chalcogenide random access memory (CRAM) that can reduce the driving current of the CRAM.

At least another objective of the present invention is to provide a chalcogenide random access memory (CRAM) that can reduce the operating current of the CRAM and ignore the difference in the thermal expansion coefficient between the chalcogenide material and other materials used in semiconductor production.

At least another objective of the present invention is to provide a method of fabricating a chalcogenide random access memory (CRAM) that can reduce the difference between the operating current of the CRAM and the current provided by a control transistor.

At least another objective of the present invention is to provide a method of fabricating a chalcogenide random access memory (CRAM) that can reduce the contact area between the chalcogenide material and the bottom electrode therein beyond the lithography limit.

At least another objective of the present invention is to provide a method of fabricating a chalcogenide random access memory (CRAM) that can simplify the fabrication process and reduce the operating current of the CRAM.

To achieve these and other advantages and in accordance with the purpose of the invention, as embodied and broadly described herein, the invention provides a chalcogenide random access memory (CRAM). The CRAM comprises a substrate, a first dielectric layer, a top electrode, a bottom electrode, a second dielectric layer, a modified chalcogenide spacer and an un-modified chalcogenide thin film. The first dielectric layer is disposed on the substrate surface and the bottom electrode is located within the first dielectric layer. The second dielectric layer is disposed on the first dielectric layer, wherein the second dielectric layer has at least one opening exposing the bottom electrode. The modified chalcogenide spacer is disposed on the sidewall of the opening exposing portion of the bottom electrode. The top electrode is disposed on the bottom electrode. The un-modified chalcogenide thin film is disposed between the modified chalcogenide spacer and the top electrode and also disposed between the bottom electrode and the top electrode. Furthermore, the modified chalcogenide spacer has a better etching resistivity than the un-modified chalcogenide thin film.

According to the CRAM of the present invention, the modified chalcogenide spacer contains oxygen, nitrogen, or other possible atom, ion or compound capable of reducing conductivity and increasing etching resistivity of the phase transformation material.

The present invention also provides another chalcogenide random access memory (CRAM). The CRAM comprises a substrate, a dielectric layer, a top electrode, a bottom electrode, a spacer, a un-modified chalcogenide material and a modified chalcogenide layer. The dielectric layer is disposed on the substrate surface and the bottom electrode is located within the first dielectric layer. The modified chalcogenide layer is disposed on the dielectric layer, wherein the modified chalcogenide layer has at least one opening exposing the bottom electrode. The spacer is disposed on the sidewall of the opening exposing portion of the bottom electrode. The top electrode is disposed on the bottom electrode. The un-modified chalcogenide material is disposed in the opening between the top electrode and the bottom electrode. Furthermore, the modified chalcogenide layer has a better etching resistivity than the un-modified chalcogenide material.

According to the CRAM of the present invention, the modified chalcogenide layer contains oxygen, nitrogen, or other possible atom, ion or compound capable of reducing conductivity of the phase transformation material.

The invention further provides a chalcogenide random access memory (CRAM). The CRAM comprises a substrate, a dielectric layer, a top electrode, a bottom electrode, a modified chalcogenide layer and an un-modified chalcogenide thin film. The dielectric layer is disposed on the substrate surface and the bottom electrode is located within the dielectric layer. The modified chalcogenide layer is disposed on the first dielectric layer, wherein the modified chalcogenide layer has at least one funneled opening exposing the bottom electrode. The top electrode is disposed on the modified chalcogenide layer in a position to correspond with the bottom electrode. The un-modified chalcogenide thin film is disposed between the modified chalcogenide layer and the top electrode and also disposed between the bottom electrode and the top electrode. Furthermore, the modified chalcogenide layer has a better etching resistivity than the un-modified chalcogenide thin film.

According to the CRAM of the present invention, the modified chalcogenide layer contains oxygen, nitrogen, or other possible atom, ion or compound capable of reducing conductivity of the phase transformation material.

The present invention also provides a method of fabricating a chalcogenide random access memory (CRAM). First, a substrate having a first dielectric layer thereon is provided. The first dielectric layer also has a bottom electrode therein. Thereafter, a chalcogenide film is formed on the substrate and then a patterned mask is formed on the chalcogenide film. Using the patterned mask, the chalcogenide film is patterned to form a chalcogenide block that has contact with the bottom electrode. After that, using the patterned mask again, a tilt ion implantation process is carried out on the chalcogenide block to convert a peripheral region of the contact area between the chalcogenide block and the bottom electrode into a modified chalcogenide structure. The modified chalcogenide structure has a better etching resistivity than the un-modified chalcogenide block. The patterned mask is removed and then the un-modified chalcogenide block is removed, too. Afterwards, a conformal chalcogenide thin film is formed over the substrate to cover the modified chalcogenide structure and contact with the bottom electrode. Then, a second dielectric layer is deposited over the substrate and patterned to expose the conformal chalcogenide thin film on the bottom electrode. Finally, a top electrode is formed over the conformal chalcogenide thin film.

According to the method of fabricating the CRAM of the present invention, the dopants implanted into the chalcogenide film in the aforementioned tilt ion implantation process includes oxygen ($O_2$), nitrogen ($N_2$), atomic oxygen (O), atomic nitrogen (N) or oxygen ion ($O^+$).

The present invention also provides an another method of fabricating a chalcogenide random access memory (CRAM). First, a substrate having a first dielectric layer thereon is provided. The first dielectric layer also has a bottom electrode therein. Thereafter, a chalcogenide film is formed on the substrate and then a patterned mask is formed on the chalcogenide film. The patterned mask corresponds in position with the bottom electrode. Using the patterned mask as a mask, an ion implantation process is carried out on the chalcogenide film to covert a portion of the chalcogenide film into a modified region. Meanwhile, the chalcogenide film underneath the patterned mask is prevented from receiving any dopants and hence is kept as an un-modified region. The modified region has a better etching resistivity than the un-modified region of the chalcogenide film. After that, the patterned mask is removed and then the un-modified region of the chalcogenide film is removed to form a opening. Thereafter, a spacer id formed on a sidewall of the opening to expose portion of the bottom electrode, and then filling the opening with an un-modified chalcogenide material. Finally, a top electrode is formed over the un-modified chalcogenide material.

According to the method of fabricating a CRAM of the present invention, the dopants implanted into the chalcogenide film in the aforementioned ion implantation process includes oxygen, nitrogen, atomic oxygen, atomic nitrogen or oxygen ion.

The present invention also provides a method of fabricating a chalcogenide random access memory (CRAM). First, a substrate having a dielectric layer thereon is provided. The dielectric layer also has a bottom electrode therein. Thereafter, a chalcogenide film is formed on the substrate and then a patterned mask is formed on the chalcogenide film. Using the patterned mask again, a tilt ion implantation process is carried out on the chalcogenide film to convert a portion of the chalcogenide film into a modified region and keep the chalcogenide film without receiving any dopants as an un-modified region. The modified region has a better etching resistivity than the un-modified region. The patterned mask is removed and then the un-modified region of the chalcogenide film is removed, too. Afterwards, a conformal chalcogenide thin film is formed over the substrate to cover the modified region of the chalcogenide film and contact with the bottom electrode. Then, a top electrode is formed over the conformal chalcogenide thin film in a position to correspond with the bottom electrode.

According to the method of fabricating a CRAM of the present invention, the dopants implanted into the chalcogenide film in the tilt ion implantation process comprises oxygen, nitrogen, atomic oxygen, atomic nitrogen or oxygen ion.

In the present invention, a material modification treatment is performed to reduce the contact area between the chalcogenide film and the bottom electrode inside the CRAM. Hence, the operating current of the CRAM is reduced to match the current value provided by a common control transistor. Furthermore, the aforementioned material modification treatment can simplify the production process, reduce the contact area between the chalcogenide material and the bottom electrode beyond the lithography limit and resolve the problems caused by a difference in the thermal expansion coefficient between the chalcogenide material and other materials used in semiconductor fabrication.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
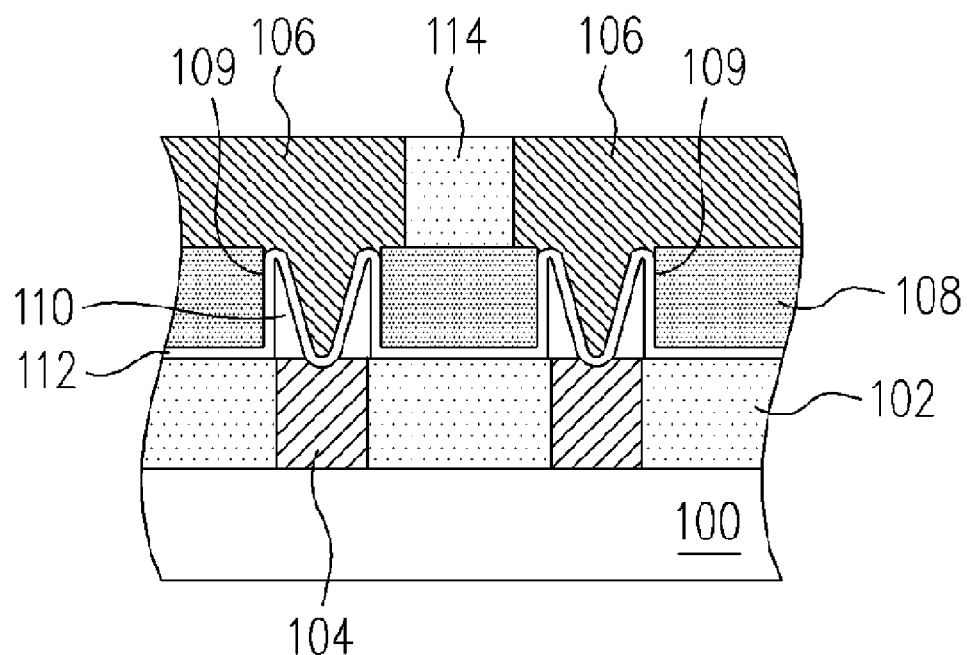
FIG. 1 is a schematic cross-sectional view of a chalcogenide random access memory according to a first embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a schematic cross-sectional view of a chalcogenide random access memory according to a first embodiment of the present invention. As shown in FIG. 1, the chalcogenide random access memory (CRAM) of the present embodiment mainly comprises a substrate 100, a first dielectric layer 102, a bottom electrode 104, a top electrode 106, a second dielectric layer 108, a modified chalcogenide spacer 110 and a un-modified chalcogenide thin film 112. The first dielectric layer 102 is disposed on the substrate 100 and the bottom electrode 104 is located inside the first dielectric layer 102. The second dielectric layer 108 is disposed on the first dielectric layer 102, wherein the second dielectric layer 108 has at least one opening 109 exposing the bottom electrode 104. The modified chalcogenide spacer 110 is disposed on the sidewall of the opening 109 exposing portion of the bottom electrode 104. The top electrode 106 is disposed on the bottom electrode 104. The un-modified chalcogenide thin film 112 is disposed between the modified chalcogenide spacer 110 and the top electrode 106 and also disposed between the bottom electrode 104 and the top electrode 106. The modified chalcogenide spacer 110 has a better etching resistivity than the un-modified chalcogenide thin film 112. The modified chalcogenide spacer 110 contains elements such as oxygen, nitrogen, or other possible atom, ion or compound capable of reducing conductivity of the phase transformation material for modifying the intrinsic physical properties of the chalcogenide compound.

As shown in FIG. 1, the top electrode 106 and the bottom electrode 104 can be fabricated using a metal, a metal alloy, a semiconductor, a silicon compound, silicon or other conductive materials, for example. Furthermore, the top electrode 106 and the bottom electrode 104 can be set in an elemental state, a compound state, an alloy state or a composite state. In addition, because two chalcogenide random access memory units are displayed in FIG. 1, a third dielectric layer 114 can be disposed between the two upper electrodes 106, for example.

Because the contact area between the un-modified chalcogenide thin film and the bottom electrode inside the CRAM is extremely less than that between the un-modified chalcogenide thin film and the top electrode in the present embodiment, the operating current (also known as the driving current) of the CRAM is lowered to match the current value capable of being provided by a common control transistor.

Figure 2:
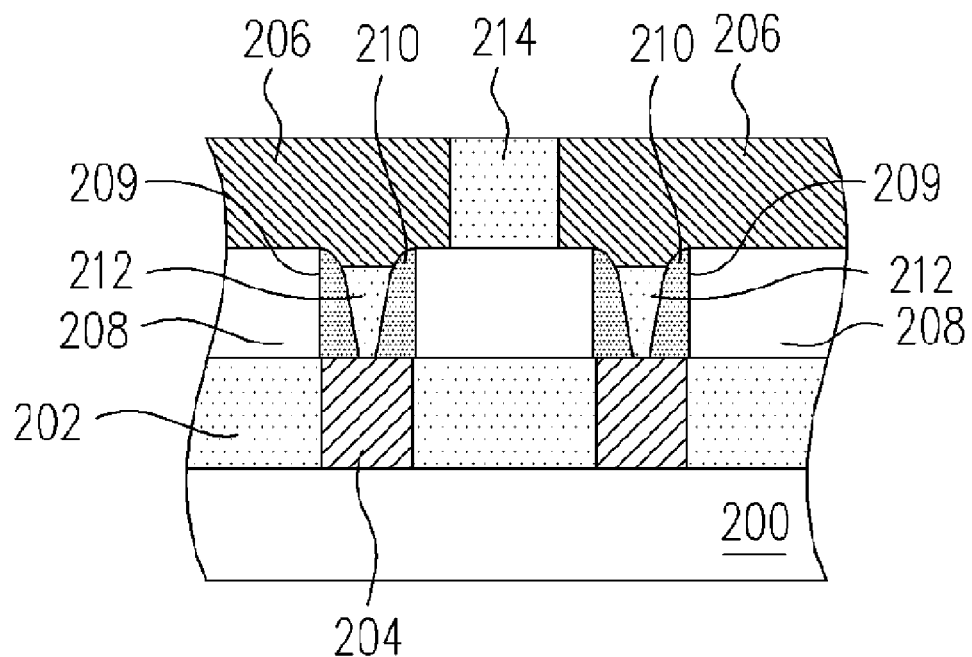
FIG. 2 is a schematic cross-sectional view of a chalcogenide random access memory according to a second embodiment of the present invention.

FIG. 2 is a schematic cross-sectional view of a chalcogenide random access memory according to a second embodiment of the present invention. As shown in FIG. 2, the chalcogenide random access memory (CRAM) in the present embodiment mainly comprises a substrate 200, a dielectric layer 202, a bottom electrode 204, a top electrode 206, a modified chalcogenide layer 208, a spacer 210 and a un-modified chalcogenide material 212. The dielectric layer 202 is disposed on the substrate 200 and the bottom electrode 204 is located inside the dielectric layer 202. The modified chalcogenide layer 208 is disposed on the dielectric layer 202, wherein the modified chalcogenide layer 208 has at least one opening 209 exposing the bottom electrode 204. The spacer 210 is disposed on the sidewall of the opening 209 so as to expose portion of the bottom electrode 204, wherein the spacer 210 can be fabricated using a dielectric or a insulator. The top electrode 206 is disposed on the bottom electrode 204. The un-modified chalcogenide material 212 is disposed in the opening 209 between the bottom electrode 204 and the top electrode 206, wherein the modified chalcogenide layer 208 has a better etching resistivity than the un-modified chalcogenide material 212. In addition, the modified chalcogenide layer 208 contains oxygen, nitrogen, or other possible atom, ion or compound capable of reducing conductivity of the phase transformation material so that the physical properties of the chalcogenide material are transformed.

As shown in FIG. 2, the materials and states of the aforementioned top electrode 206 and the bottom electrode 204 can be selected by referring to the first embodiment. Furthermore, because two chalcogenide random access memory units are shown in FIG. 2, another dielectric layer 214 is disposed between the two top electrodes 206, for example.

In the CRAM of the present embodiment, the contact area between the un-modified chalcogenide material and the bottom electrode is less than that between the un-modified chalcogenide material and the top electrode due to the disposition of the spacer. Hence, the driving current of the CRAM is lowered.

Figure 3:
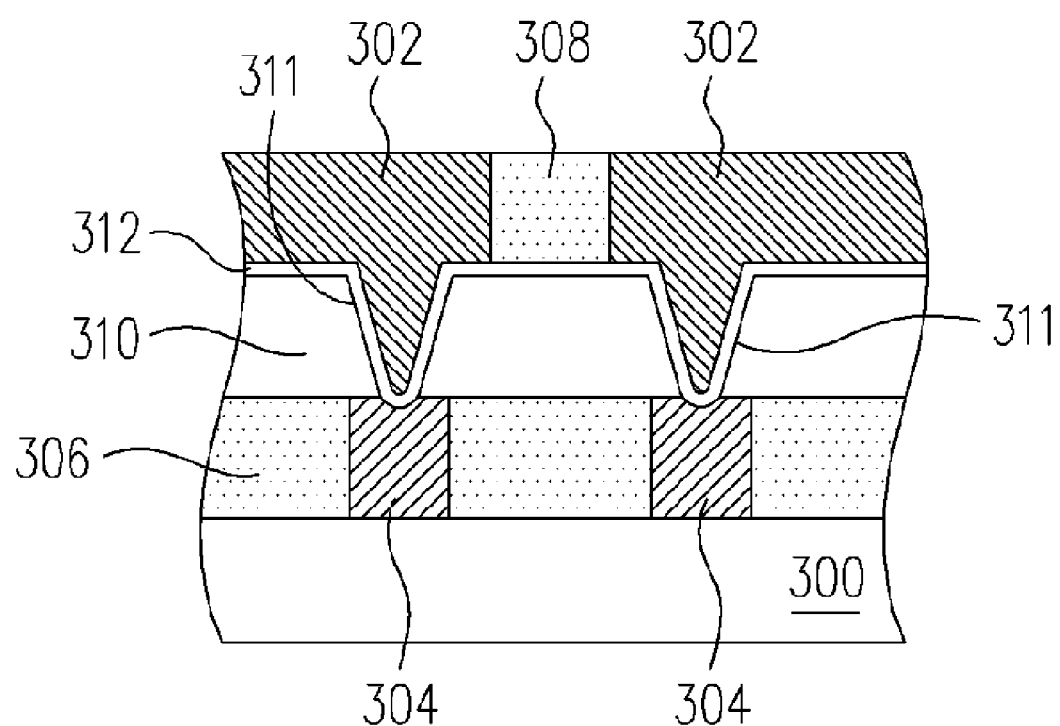
FIG. 3 is a schematic cross-sectional view of a chalcogenide random access memory according to a third embodiment of the present invention.

FIG. 3 is a schematic cross-sectional view of a chalcogenide random access memory according to a third embodiment of the present invention. As shown in FIG. 3, the chalcogenide random access memory (CRAM) in the present embodiment is very similar to the one in the second embodiment. The CRAM mainly comprises a substrate 300, a top electrode 302, a bottom electrode 304, a dielectric layer 306, a modified chalcogenide layer 310 and a un-modified chalcogenide thin film 312. The dielectric layer 306 is disposed on the substrate 300 and the bottom electrode 304 is located inside the dielectric layer 306. The modified chalcogenide layer 310 is disposed on the dielectric layer 306, wherein the modified chalcogenide layer 310 has at least one funneled opening 311 exposing the bottom electrode 304. The top electrode 302 is disposed on the modified chalcogenide layer 310 in a position to correspond with the bottom electrode 304. The un-modified chalcogenide thin film 312 is disposed between the modified chalcogenide layer 310 and the top electrode 308, and it also disposed between the bottom electrode 304 and the top electrode 302. Furthermore, the modified chalcogenide layer 310 has a better etching resistivity than the un-modified chalcogenide thin film 312. In addition, another dielectric layer 308 is disposed between the two top electrodes 302, for example.

The materials and states of the aforementioned top electrode 302 and the bottom electrode 304 can be selected by referring to the first embodiment.

In the present embodiment, because area of contact between the un-modified chalcogenide thin film and the bottom electrode is smaller, the operating current of the CRAM is reduced. In addition, the modified chalcogenide layer in the present embodiment may also serve as a dielectric layer of the memory so that the conventional problem resulting from the difference in the thermal expansion coefficient between the chalcogenide compound and other materials can be avoided.

Figure 4A:
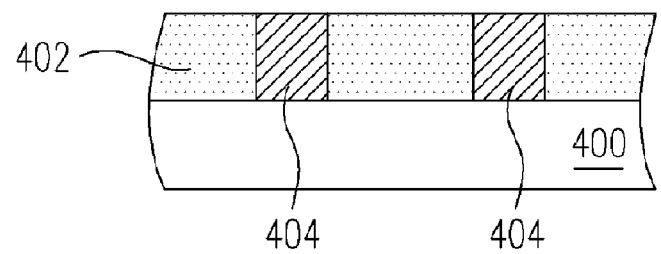
FIGS. 4A through 4H are schematic cross-sectional views showing the steps for fabricating a chalcogenide random access memory according to a fourth embodiment of the present invention.

FIG. 4A through 4H are schematic cross-sectional views showing the steps for fabricating a chalcogenide random access memory according to a fourth embodiment of the present invention. As shown in FIG. 4A, a substrate 400 having a first dielectric layer 402 thereon is provided. Furthermore, the first dielectric layer 402 has a bottom electrode 404 therein.

Figure 4B:
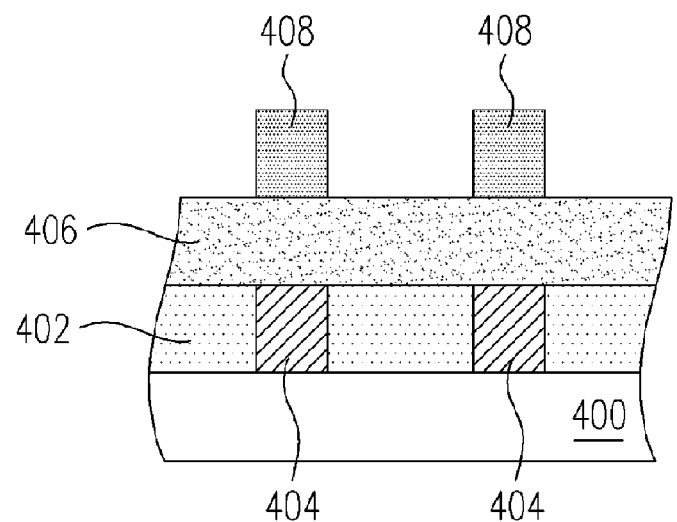

Thereafter, as shown in FIG. 4B, a chalcogenide film 406 is formed over the substrate 400 and then a patterned mask 408 is formed over the chalcogenide film 406. The patterned mask 408 is a photoresist layer or a hard mask, for example.

Figure 4C:
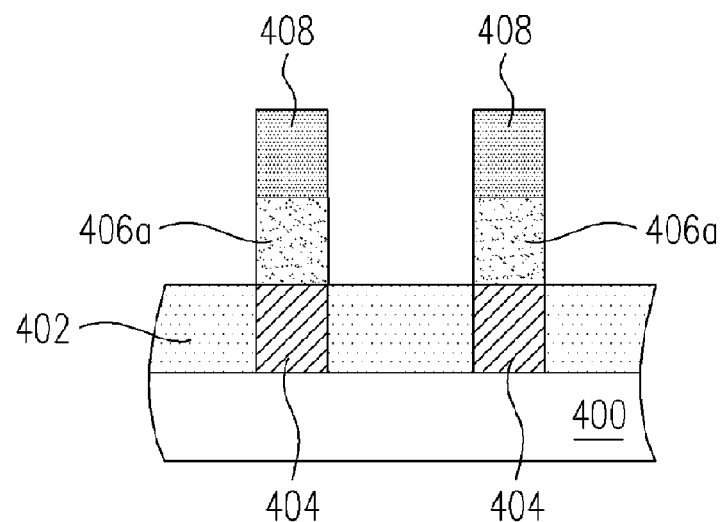

As shown in FIG. 4C, the chalcogenide film 406 (as shown in FIG. 4B) is patterned using the pattern mask 408 to form a chalcogenide block 406a in contact with the bottom electrode 404.

Figure 4D:
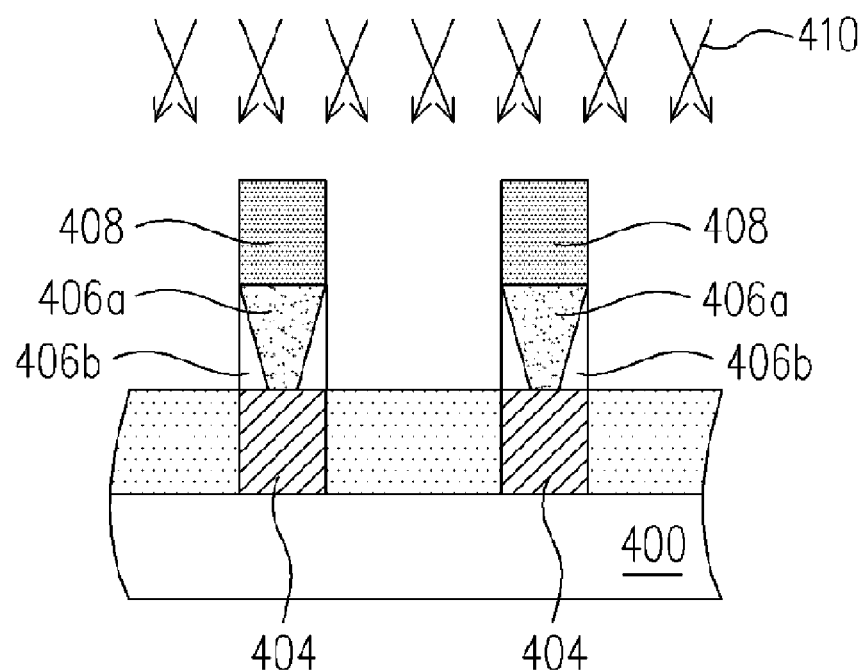

As shown in FIG. 4D, using the patterned mask 408 again, a tilt ion implantation process 410 is performed on the chalcogenide block 406a so that a peripheral portion of the contact area between the chalcogenide block 406a and the bottom electrode 404 is converted into a modified chalcogenide structure 406b. The modified chalcogenide structure 406b has a better etching resistivity than the un-modified chalcogenide block 406a. The dopants implanted into the chalcogenide film 406 include oxygen ($O_2$), nitrogen ($N_2$), atomic oxygen (O), atomic nitrogen (N) or oxygen ion ($O^+$), for example, or other possible atom, ion or compound capable of increasing etching resistivity of the phase transformation material.

Figure 4E:
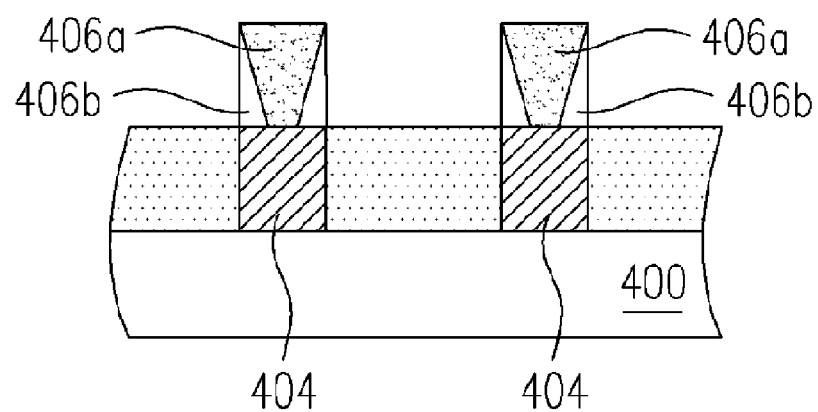

As shown in FIG. 4E, the patterned mask 408 (as shown in FIG. 4D) is removed.

Figure 4F:
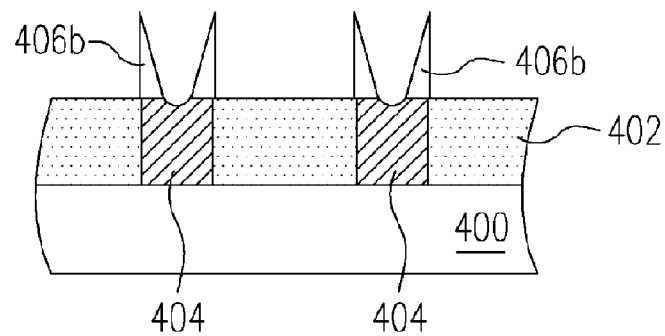

As shown in FIG. 4F, the un-modified chalcogenide block 406a (as shown in FIG. 4E) is removing and this removing step includes blanket etching the un-modified chalcogenide block, for example.

Figure 4G:
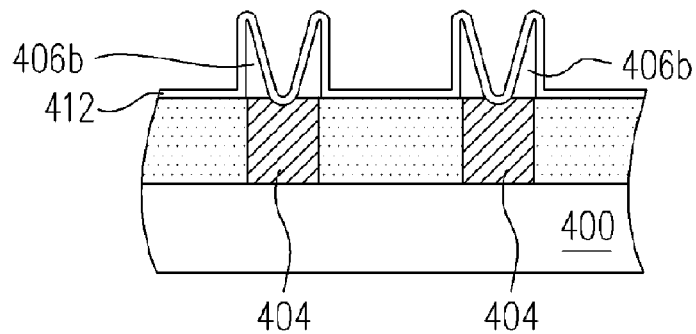

As shown in FIG. 4G, a conformal chalcogenide thin film 412 is formed over the substrate 400 to cover the modified chalcogenide structure 406b and contact with the bottom electrode 404.

Figure 4H:
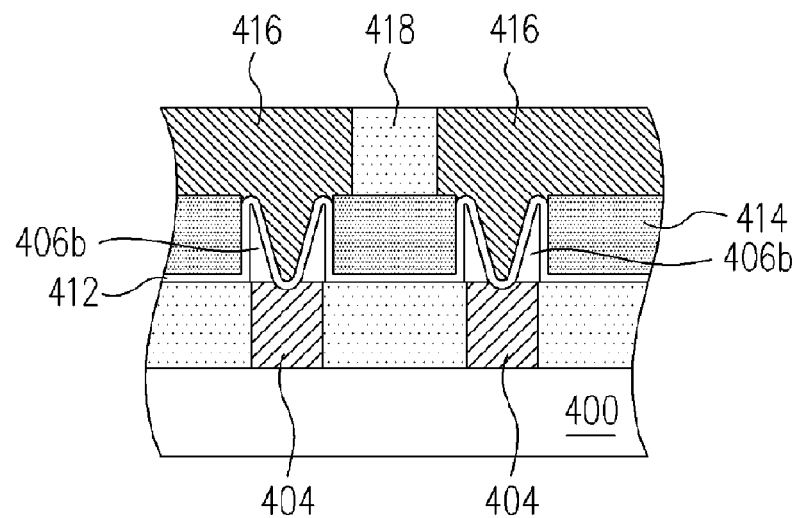

As shown in FIG. 4H, a second dielectric layer 414 is deposited on the substrate 400 and then patterned to expose the conformal chalcogenide thin film 412 on the bottom electrode 404. Thereafter, a top electrode 416 is formed over the conformal chalcogenide thin film 412 and then an inter-layer dielectric layer 418 is disposed between two neighboring top electrodes 416.

In the present embodiment, the contact area between the conformal chalcogenide thin film and the bottom electrode inside the CRAM is significantly reduced. Consequently, the operating current of the CRAM is lowered to match the current value provided by a common control transistor.

Figure 5A:
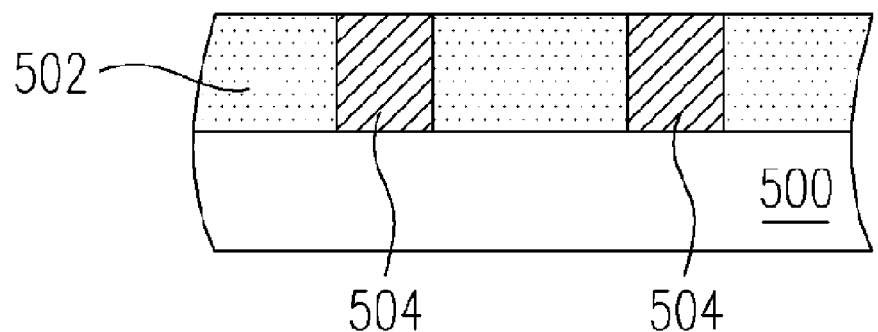
FIGS. 5A through 5E are schematic cross-sectional views showing the steps for fabricating a chalcogenide random access memory according to a fifth embodiment of the present invention.

FIG. 5A through 5E are schematic cross-sectional views showing the steps for fabricating a chalcogenide random access memory according to a fifth embodiment of the present invention. As shown in FIG. 5A, a substrate 500 having a first dielectric layer 502 thereon is provided. Furthermore, the first dielectric layer 502 has a bottom electrode 504 therein.

Figure 5B:
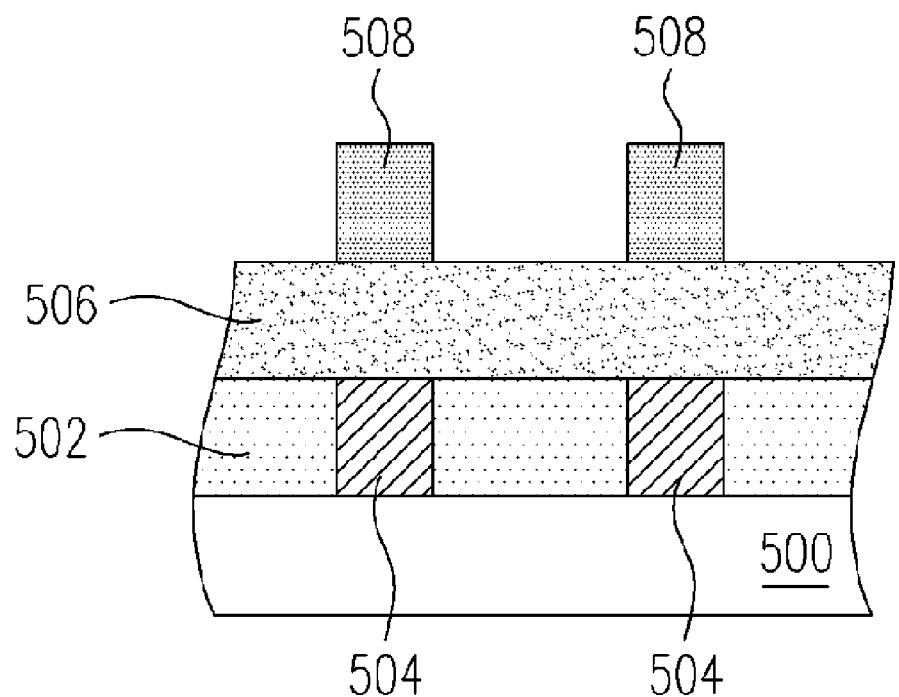

Thereafter, as shown in FIG. 5B, a chalcogenide film 506 is formed over the substrate 500 and then a patterned mask 508 is formed over the chalcogenide film 506. The patterned mask 508 is a photoresist layer or a hard mask, for example.

Figure 5C:
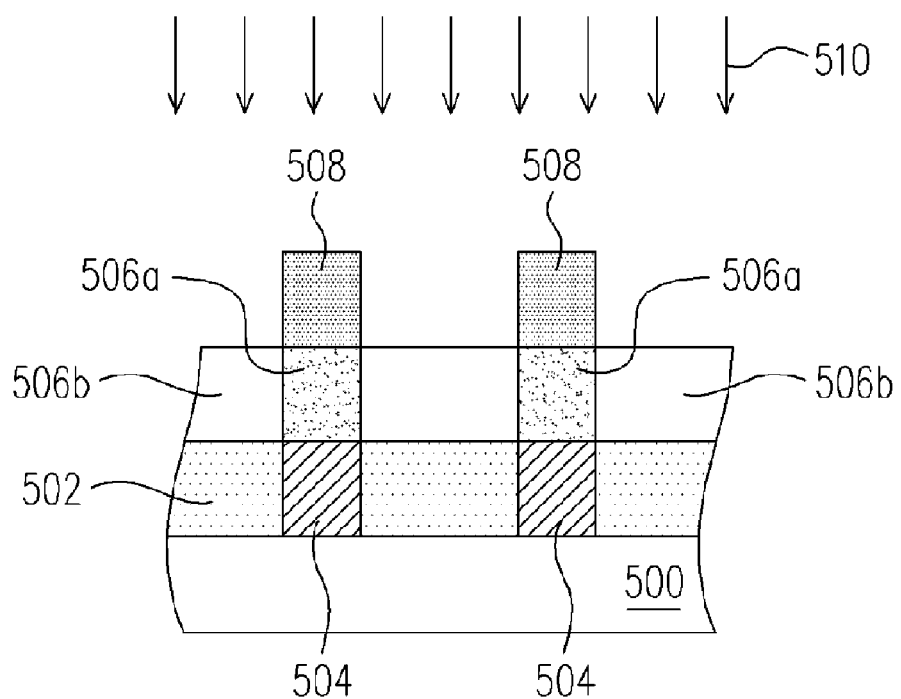

As shown in FIG. 5C, an ion implantation process 510 is performed on the chalcogenide film 506 (shown in FIG. 5B). The ion implantation process 510 implants dopants vertically into the substrate 500 to convert a portion of the chalcogenide film into a modified region 506b. Meanwhile, the chalcogenide film underneath the patterned mask 508 is prevented from receiving any dopants and hence is kept as a un-modified region 506a. The modified region 506b has a better etching resistivity than the un-modified region 506a. The dopants implanted into the chalcogenide film 506 in the ion implantation process 510 include oxygen, nitrogen, atomic oxygen, atomic nitrogen or oxygen ion, for example, or other possible atom, ion or compound capable of increasing etching resistivity of the phase transformation material.

Figure 5D:
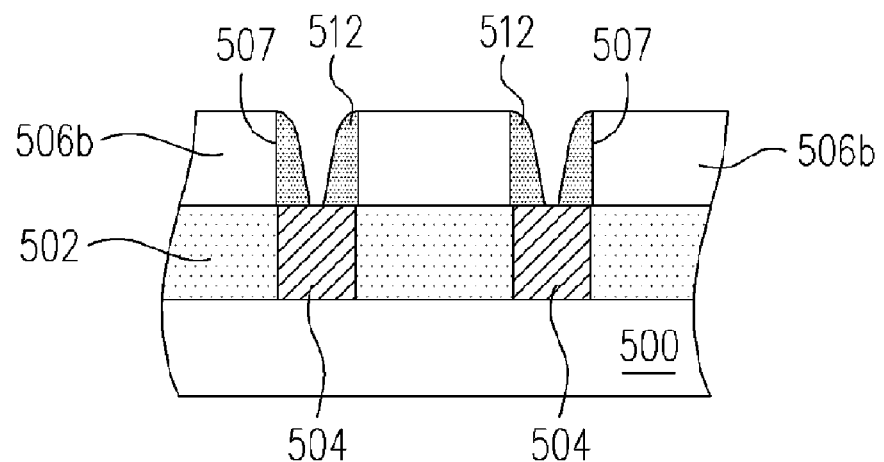

As shown in FIG. 5D, the patterned mask 508 (as shown in FIG. 5C) is removed and then the un-modified region 506a (as shown in FIG. 5C) is remove to form a opening 507. Afterward, a spacer 512 is formed on a sidewall of the opening 507 to expose portion of the bottom electrode 504.

Figure 5E:
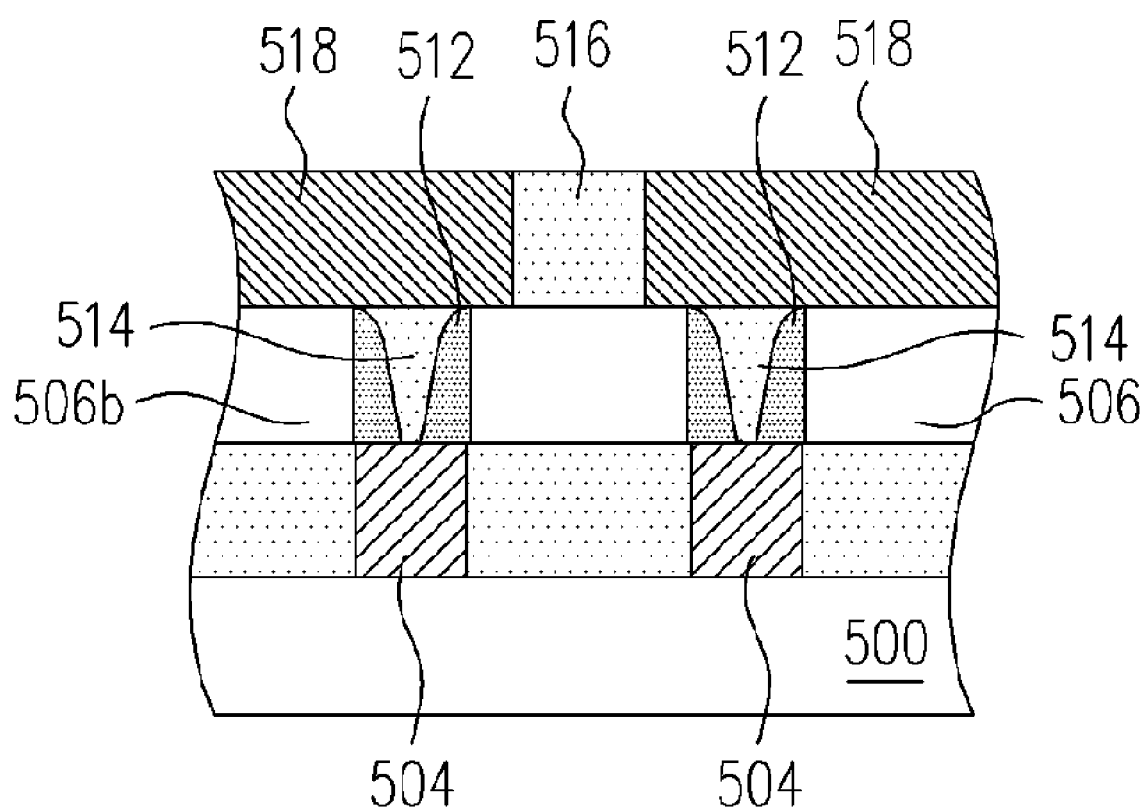

As shown in FIG. 5E, the opening 507 is filled with a un-modified chalcogenide material 514. For example, the step of filling the opening includes depositing a chalcogenide layer on the substrate 500, and then etching back the foregoing chalcogenide layer. Then, a top electrode 518 is formed over the un-modified chalcogenide material 514. Finally, an inter-layer dielectric layer 516 can be disposed between neighboring top electrodes 518.

In the present embodiment, a special material modifying treatment, that is, the ion implantation process is performed. Hence, the fabrication process is very much simplified.

Figure 6A:
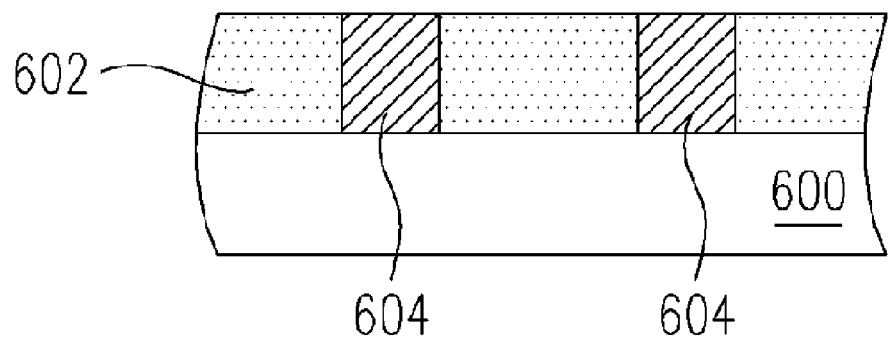
FIGS. 6A through 6E are schematic cross-sectional views showing the steps for fabricating a chalcogenide random access memory according to a sixth embodiment of the present invention.

FIG. 6A through 6E are schematic cross-sectional views showing the steps for fabricating a chalcogenide random access memory according to a sixth embodiment of the present invention. As shown in FIGS. 6A, a dielectric layer 602 having a bottom electrode 604 is formed on a substrate 600.

Figure 6B:
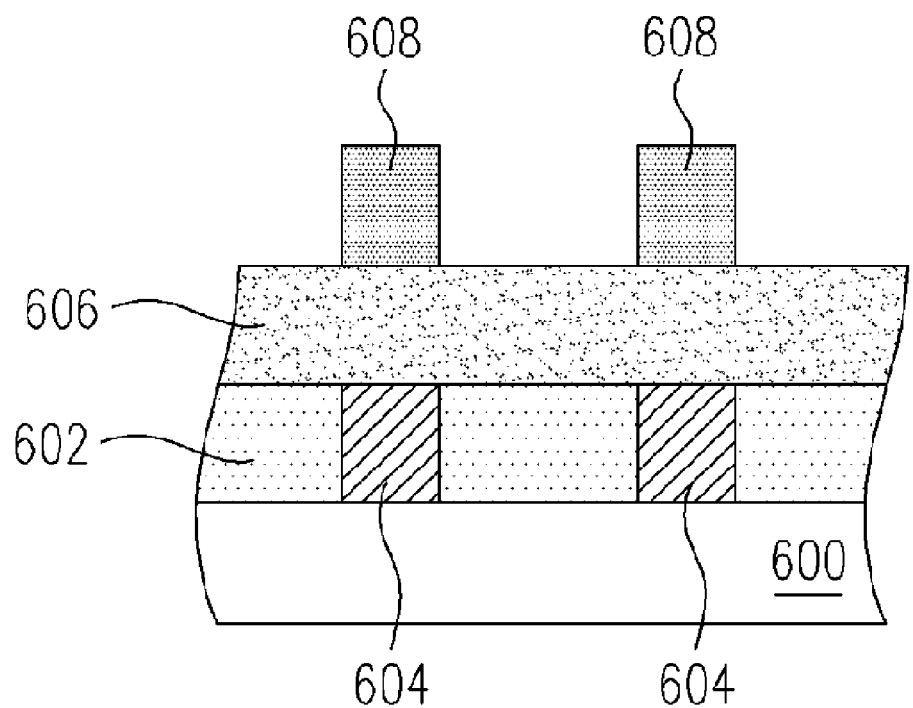

As shown in FIG. 6B, a chalcogenide film 606 and a patterned mask 608 are sequentially formed over the substrate 600. The patterned mask 608 is a photoresist layer or a hard mask, for example.

Figure 6C:
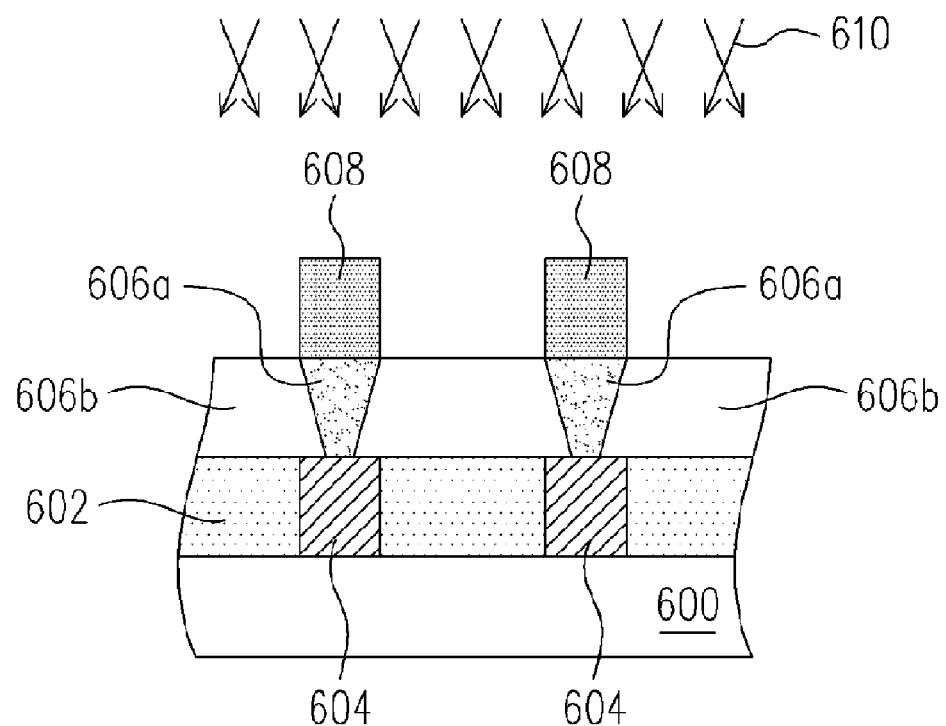

As shown in FIG. 6C, a tilt ion implantation process 610 is performed on the chalcogenide film 606 (shown in FIG. 6B) to convert a portion of the chalcogenide film 606 into a modified region 606b and keep the chalcogenide film without receiving any dopants as a un-modified region 606a. The modified region 606b has a better etching resistivity than the un-modified region 606a. The dopants implanted into the chalcogenide film 606 include oxygen, nitrogen, atomic oxygen, atomic nitrogen or oxygen ion, for example, or other possible atom, ion or compound capable of increasing etching resistivity of the phase transformation material.

Figure 6D:
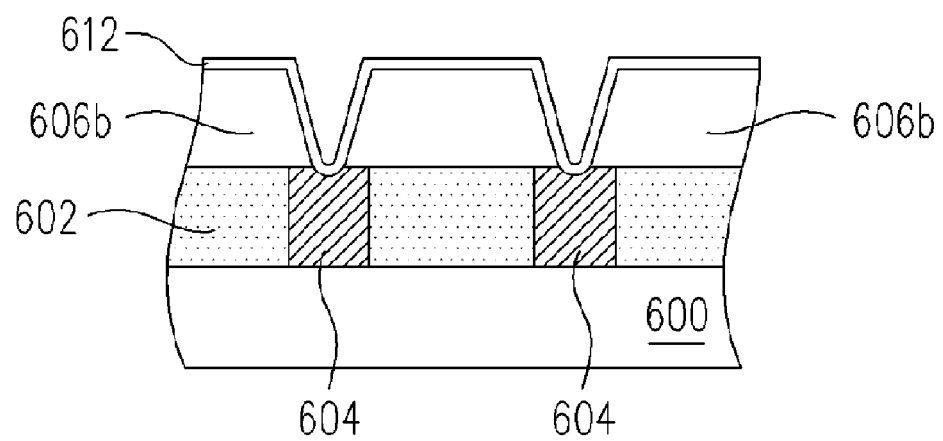

As shown in FIGS. 6D, the patterned mask 608 (shown in FIG. 6C) is removed and then the un-modified region 606a (shown in FIG. 6C) is removed, too. Thereafter, a conformal chalcogenide thin film 612 is formed over the substrate 600 to cover the modified region 606b and contact with the bottom electrode 604.

Figure 6E:
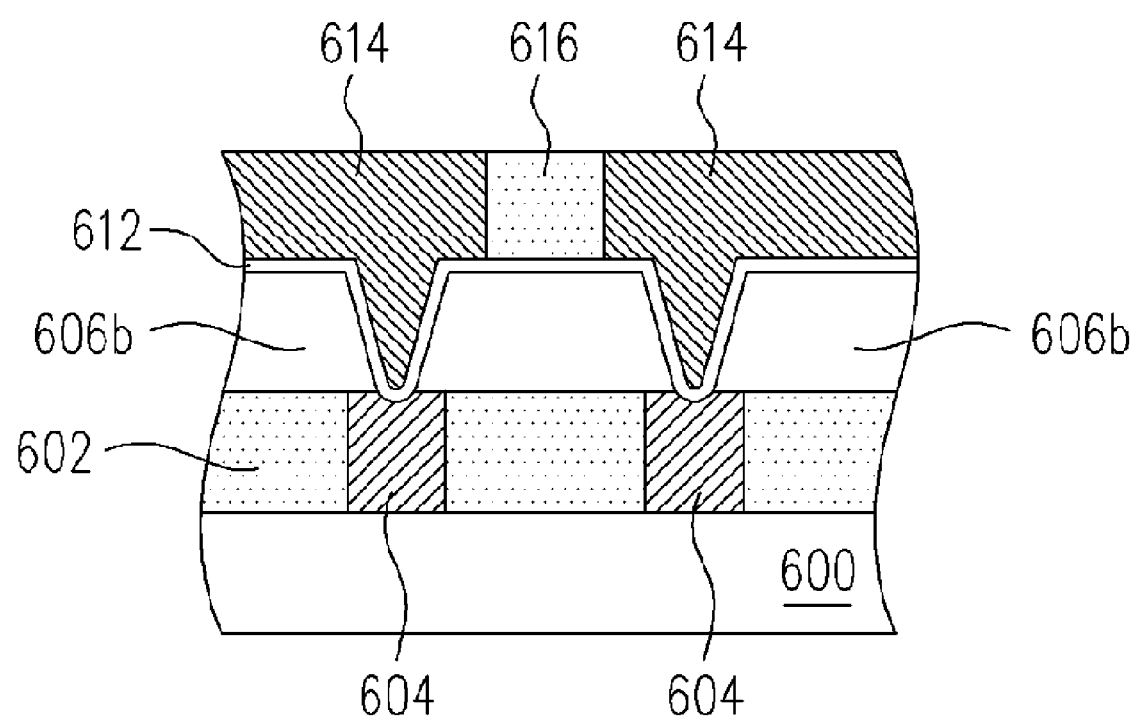

As shown in FIGS. 6E, a top electrode 614 is formed over the conformal chalcogenide thin film 612 in at least a position to correspond with the bottom electrode 604.

Finally, an inter-layer dielectric layer 616 can be disposed between neighboring top electrodes 614.

In summary, the characteristic of the present invention is that a material modification treatment is performed to reduce the contact area between the chalcogenide film and the bottom electrode inside the CRAM. Hence, the operating current of the CRAM is reduced to match the current value provided by a common control transistor.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A chalcogenide random access memory, comprising:
   a substrate;
   a first dielectric layer disposed on a surface of the substrate;
   a bottom electrode disposed within the first dielectric layer;
   a second dielectric layer disposed on the first dielectric layer, wherein the second dielectric layer has at least one opening exposing the bottom electrode;
   a modified chalcogenide spacer disposed on the sidewall of the opening exposing portion of the bottom electrode, wherein the modified chalcogenide spacer exposes portion of the bottom electrode;
   a top electrode disposed on the bottom electrode; and
   a un-modified chalcogenide thin film disposed between the modified chalcogenide spacer and the top electrode and disposed between the bottom electrode and the top electrode and contacting with the bottom electrode, wherein the modified chalcogenide spacer has a better etching resistivity than the un-modified chalcogenide thin film.

2. The chalcogenide random access memory of claim 1, wherein the material constituting the top electrode and the bottom electrode comprises metal, metal alloy, semiconductor, silicon compound or a silicon material.

3. The chalcogenide random access memory of claim 1, wherein the state of the top electrode and the bottom electrode comprises an elemental state, a compound, an alloy or a composite.

4. The chalcogenide random access memory of claim 1, wherein the modified chalcogenide spacer contains oxygen or nitrogen.

5. A chalcogenide random access memory, comprising:
   a substrate;
   a dielectric layer disposed on a surface of the substrate;
   a bottom electrode disposed within the dielectric layer;
   a modified chalcogenide layer disposed on the dielectric layer, wherein the modified chalcogenide layer has at least one opening exposing the bottom electrode;
   a spacer disposed on the sidewall of the opening to expose portion of the bottom electrode;
   a top electrode disposed on the bottom electrode; and
   a un-modified chalcogenide material disposed in the opening between the bottom electrode and the top electrode, wherein the modified chalcogenide layer has a better etching resistivity than the un-modified chalcogenide material.

6. The chalcogenide random access memory of claim 5, wherein the material constituting the top electrode and the bottom electrode comprises metal, metal alloy, semiconductor, silicon compound or a silicon material.

7. The chalcogenide random access memory of claim 5, wherein the state of the top electrode and the bottom electrode comprises an elemental state, a compound, an alloy or a composite.

8. The chalcogenide random access memory of claim 5, wherein the modified chalcogenide layer contains oxygen or nitrogen.

9. A chalcogenide random access memory, comprising:
   a substrate;
   a dielectric layer disposed on a surface of the substrate;
   a bottom electrode disposed within the dielectric layer;
   a modified chalcogenide layer disposed on the first dielectric layer, wherein the modified chalcogenide layer has at least one funneled opening exposing the bottom electrode;
   a top electrode disposed on the modified chalcogenide layer in a position to correspond with the bottom electrode; and
   a un-modified chalcogenide thin film disposed between the modified chalcogenide layer and the top electrode and disposed between the bottom electrode and the top electrode, wherein the modified chalcogenide layer has a better etching resistivity than the un-modified chalcogenide thin film.

10. The chalcogenide random access memory of claim 9, wherein the material constituting the top electrode and the bottom electrode comprises metal, metal alloy, semiconductor, silicon compound or a silicon material.

11. The chalcogenide random access memory of claim 9, wherein the state of the top electrode and the bottom electrode comprises an elemental state, a compound, an alloy or a composite.

12. The chalcogenide random access memory of claim 9, wherein the modified chalcogenide layer contains oxygen or nitrogen.

* * * * *